United States Patent
Osen et al.

(10) Patent No.: US 9,055,665 B2
(45) Date of Patent: Jun. 9, 2015

(54) INTERFACE BETWEEN A SECURITY MODULE AND A HOST DEVICE

(75) Inventors: Karl Osen, Cheseaux-sur-Lausanne (CH); Ernest Odoom, Geneva (CH)

(73) Assignee: NAGRAVISION S.A.S, Cheseaux-sur-Lausanne (CH)

( * ) Notice: Subject to any disclaimer, the term of this patent is extended or adjusted under 35 U.S.C. 154(b) by 532 days.

(21) Appl. No.: 13/298,785

(22) Filed: Nov. 17, 2011

(65) Prior Publication Data

US 2012/0127672 A1 May 24, 2012

Related U.S. Application Data

(60) Provisional application No. 61/414,907, filed on Nov. 18, 2010.

(51) Int. Cl.
 H05K 7/00 (2006.01)
 H05K 9/00 (2006.01)
 G06F 1/18 (2006.01)

(52) U.S. Cl.
 CPC .............. *H05K 9/0018* (2013.01); *G06F 1/182* (2013.01)

(58) Field of Classification Search
 CPC ...... H01L 23/552; H05K 9/00; H05K 9/0037; H05K 9/0007; G06F 1/1656; G06F 1/182
 USPC .................... 361/679.01, 728, 737, 816, 818; 174/350, 377, 382
 See application file for complete search history.

(56) References Cited

U.S. PATENT DOCUMENTS

| | | | |
|---|---|---|---|
| 5,265,951 A * | 11/1993 | Kumar | 312/223.2 |
| 5,436,803 A | 7/1995 | Annis et al. | |
| 5,532,466 A * | 7/1996 | Konno et al. | 235/441 |
| 6,101,711 A * | 8/2000 | Kobayashi | 29/854 |
| 6,134,121 A * | 10/2000 | Braxton | 361/818 |
| 6,223,298 B1 | 4/2001 | Tellier et al. | |
| 6,402,032 B1 | 6/2002 | Huang et al. | |
| 6,837,439 B2 * | 1/2005 | Kitchen | 235/492 |
| 7,351,919 B1 | 4/2008 | Knoke et al. | |
| 7,542,534 B2 | 6/2009 | Ebert | |
| 7,760,515 B2 * | 7/2010 | Sun | 361/818 |
| 2002/0050516 A1 * | 5/2002 | Kitchen | 235/441 |
| 2011/0221572 A1 | 9/2011 | Wang | |
| 2012/0126009 A1 * | 5/2012 | Osen et al. | 235/441 |

FOREIGN PATENT DOCUMENTS

WO WO 2005/106953 11/2005

OTHER PUBLICATIONS

European Office Action issued in EP 10 19 1635, dated May 19, 2011.
U.S. Appl. No. 13/298,774.

* cited by examiner

*Primary Examiner* — Bernard Rojas
(74) *Attorney, Agent, or Firm* — DLA Piper LLP US

(57) ABSTRACT

The present invention may be deployed in a system comprising a security module housed on a chip card and a host device comprising a chip card reader. The host device is comprised in a housing with a slot for the chip card. The housing is shielded to reduce the amount of electromagnetic radiation generated by the security module and/or the host device from penetrating to the exterior of the housing. Similarly, the shielding is adapted to reduce the effects of electromagnetic radiation generated outside of the host device on the components within the housing. The slot is also shielded by a flap made of an electrically conductive epoxy material or an electrically conductive resin.

8 Claims, 3 Drawing Sheets

INTERFACE BETWEEN A SECURITY MODULE AND A HOST DEVICE

CROSS REFERENCE TO RELATED APPLICATIONS

This application claims priority under 35 U.S.C. Section 119 to U.S. Provisional Application No. 61/414,907, filed Nov. 18, 2010, the entire contents of which are hereby incorporated by reference herein.

INTRODUCTION

The present invention relates to the domain of radio frequency electromagnetic interference and more specifically to methods and devices for the reduction of such interference in electronic circuits.

STATE OF THE ART

With the increasing use of higher and higher signal frequencies in the operation of electronic circuits, the problems related to electromagnetic interference or EMI are becoming more acute. In the domain of conditional access, the use of a security module is commonplace. A security module is usually used in cooperation with a host device which comprises at least a card reader to interface with the security module. The host device may further comprise a cryptographic module and other related conditional access hardware and software. The security module holds personalised information such as cryptographic keys and the like, which need to be kept secret. The security module is generally a portable device which is detachable from the host device.

A common example of a security module is an electronic chip housed on a card, generally in the form of a credit card, a SIM card or a micro-SIM card or other similar support. The card is usually presented to the host module, or more particularly to the card reader within the host module, via a slot in the host module. Contact is made between the chip and the card reader by a set of contacts which come to rest on a set of corresponding contact pads on a surface of the card, which connect to the chip.

With the tendency for operating frequencies of the aforementioned security modules to be higher, i.e. in ranges in excess of several hundreds of megahertz, any connections to the security module which carry signals with frequency components in such ranges, namely connections to clock and data pins for example, will tend to emit electromagnetic radiation. Such electromagnetic radiation may be intercepted by a third party and used to breach the security of the security module. For example by monitoring the electromagnetic radiation during the time that the security module transmits a secret key, it may be possible for a third party to reconstruct the secret key for malicious purposes. Similarly, a security module may be susceptible to interference by sufficiently strong electromagnetic fields generated externally to the security module for the purpose of influencing the operation of the security module and/or card reader during operation. Such interference, generated either externally or internally by the security module or any of the other circuitry within the host during operation, is known as electromagnetic interference or EMI.

The EMI phenomenon is well known in the electronics industry. Indeed, there are industry-standard limits placed on electronic circuits relative to the amount of electromagnetic radiation such circuits are allowed to generate. These limits are designed to minimise the possibility of circuits susceptible to generating large quantities of EMI from affecting neighbouring circuits and to avoid the risk of physical harm to humans in the vicinity of such circuits.

It is usual, in the domain of electronic circuits which are designed to operate at radio frequencies (RF), to enclose such circuits within a box whose walls are entirely covered by a material which has the properties of providing shielding against electromagnetic radiation. This generally provides sufficient protection against radiation produced by the circuit from escaping towards the outside of the enclosed box and against radiation generated outside of the box from penetrating into the box and interfering with the operation of the circuit.

However, in the case of a host device designed to receive a security module via a slot or port, it is difficult to prevent EMI from escaping since the port presents a discontinuity in the enclosure and therefore a discontinuity in the shielding thereby exposing an area where EMI may escape. U.S. Pat. No. 7,351,919 B1 describes a port cover for limiting transfer of electromagnetic radiation from the port of a host device when the security module is functioning within the port. A port cover is mounted over the slot for the chip card after the chip card is entered. The port cover is lined with a conductive material, which contributes to the EMI shielding properties of the port cover and permits for an electrical circuit to be completed when the port cover is in position, thus allowing for the detection of whether or not the port cover is properly closed.

There also exist devices for providing a shield around electronic components susceptible to emitting EMI such as the device described in U.S. Pat. No. 5,436,803 which teaches of a flexible envelope surrounding an electronic circuit card within the host device, the electronic circuit card comprising the offending component. The flexible envelope comprises an insulating sheet such as polyethylene and a sheet of conductive fibres such as metalised nylon giving a resistivity in the order of a tenth of an ohm. Another example is described in International Patent Application Publication number WO 2005/106953 A1, which discloses a screening layer, comprising a layer of soft magnetic material of high relative permeability such as iron, nickel or cobalt or any of their alloys, placed on the surface of the component susceptible to emit the offending EMI. The document further goes on to describe the use of a further layer of additional hard material, such as diamond-like carbon, on the surface of the offending component to prevent access to the component through mechanical or chemical means.

BRIEF SUMMARY OF THE INVENTION

In view of the prior art, it is an aim of the present invention to provide a means for reducing the amount of electromagnetic interference detectable from the outside of a host device while the host device is communicating with a security module, especially when the host device comprises a slot or port through which the security module is inserted.

It is a further aim of the present invention to provide a means for reducing the amount of electromagnetic interference escaping from a security module towards electronic components comprised within a host device while the security module is communicating with the host device.

It is a further aim of the present invention to provide for such reduction in electromagnetic interference while retaining ease of physical access to the host device by the security module, thereby allowing ease of exchanging one security module for another. This requirement therefore precludes the possibility of using a port cover or a flexible envelope as described in the prior art as well as the use of screening layers around the security module. Additionally, an aim of the present invention is to reduce the manufacturing costs associated with the production of host devices intended to receive security modules which function at operating frequencies high enough to generate the undesired EMI and therefore the use of expensive screening layers such as those described in the prior art is not a desired option.

The aims of the present invention are therefore achieved by providing an interface module for providing an electrical interface between a security module and a host device, said interface module comprising:
  a housing; and
  an electronic component disposed within the housing, the electronic component having at least one contact configured to make electrical contact with a corresponding contact on the security module;
  wherein the housing has a slot formed therein, the slot being sized and shaped to allow the security module to be inserted therethrough, the housing further comprising a movable slot shield for substantially attenuating through propagation of electromagnetic interference generated inside the housing or generated outside the housing, said movable slot shield being made from one of electrically conductive epoxy or electrically conductive resin, the movable slot shield being configured to allow passage of the security module through the slot such that the contact of the electronic component contacts the corresponding contact on the security module.

There is also provided an interface module for providing an electrical interface between a security module and a host device, said interface module comprising:
  a housing; and
  an electronic component disposed within the housing, the electronic component having at least one contact configured to make electrical contact with a corresponding contact on the security module;
  wherein at least one pathway extending from a point where the electrical contact is made is covered by alternate layers of one of non-conducting and conducting adhesives, non-conducting and conducting tapes, non-conducting and conducting resins or non-conducting and conducting epoxies.

BRIEF DESCRIPTION OF THE DRAWINGS

The present invention will be better understood thanks to the detailed description which follows and the accompanying drawings, which are given as non-limiting examples of embodiments of the invention, where.

DETAILED DESCRIPTION

Figure 1:
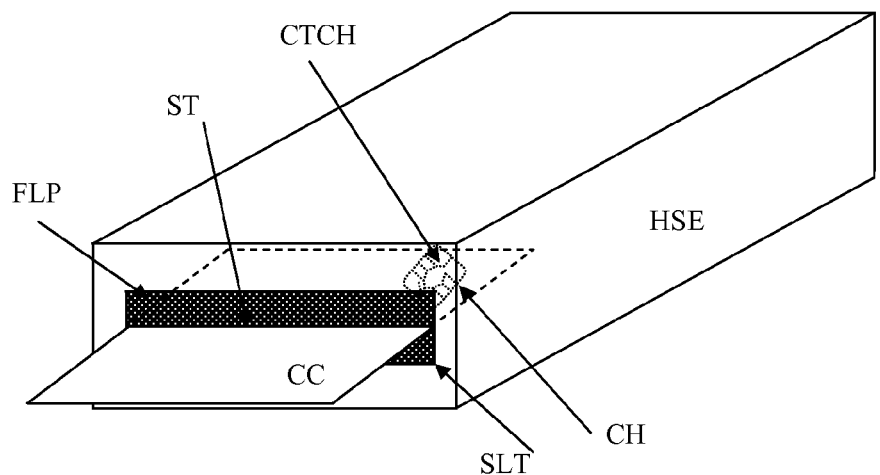
FIG. 1 shows a chip card with a security module inserted through a flap into a housing according to an embodiment of the present invention.

In a system comprising a host device and a detachable security module (CH), wherein the a card reader within the host device is adapted to form an interface with the detachable security module (CH), at least some of the signals in the interface will carry high frequency signals susceptible to producing or being affected by electromagnetic interference. Depending on the design of the host device and any components therein, there may be further areas within the host device which are susceptible to EMI. According to an embodiment of the present invention, techniques are employed to provide means to minimise the amount of EMI from penetrating from the interior of the host device to the exterior or from the exterior to the interior. For example, any connections carrying signals having a frequency component are kept as short as possible as it is known that the length over which a high frequency signal is present is a significant variable contributing to the amount of EMI emitted. Additionally, these lines are preferably made from shielded cabling.

According to an embodiment of the present invention, a shield is built to substantially reduce any EMI generated inside the host device from penetrating to the outside of the host. In this embodiment, the shield is in the form of a flap (FLP) covering the port or slot (SLT) of the host device through which the chip card (CC) which comprises the security module (SM) is inserted. The flap (FLP) is made of an electrically conductive epoxy material or an electrically conductive resin and is suitably dimensioned and positioned so as to adequately enclose the chip card (CC) as it is inserted into the slot (SLT). In this manner, since the epoxy or resin exhibits elastic properties, a seal is formed around the chip card (CC) when it is inserted into the slot (SLT). Since the epoxy or resin is electrically conductive, the flap (FLP) provides EMI shielding such that any EMI generated within the host device does not propagate outside of the host device or is at least substantially attenuated so as not to be considered a problem. According to variants of this embodiment of the invention, the flap (FLP) may be formed by one sheet of the epoxy or resin, attached to either the top or bottom of the slot (SLT) or the flap (FLP) can be made from a larger sheet of the epoxy or resin with a slit cut near the middle of the sheet to receive the chip card (CC) or the flap (FLP) may be realised by two sheets of epoxy or resin material, the two sheets being suitably fixed to the slot (SLT) such that the edges of the two sheets come together thus forming the flap (FLP) near the middle of the slot (SLT). Since the flap, or flaps, is (are) made of epoxy or resin, thanks to their elasticity they can be simply fixed to the housing by simple fastening, clipping, gluing, soldering or welding for example, without the need for any additional fixtures such as hinges or the like. The elasticity of the flap(s) suffices for the desired effect of allowing the chip card to be inserted while providing a seal sufficient to sufficiently attenuate through-propagation of EMI, either from inside the housing to the outside or vice-versa.

Figure 2:
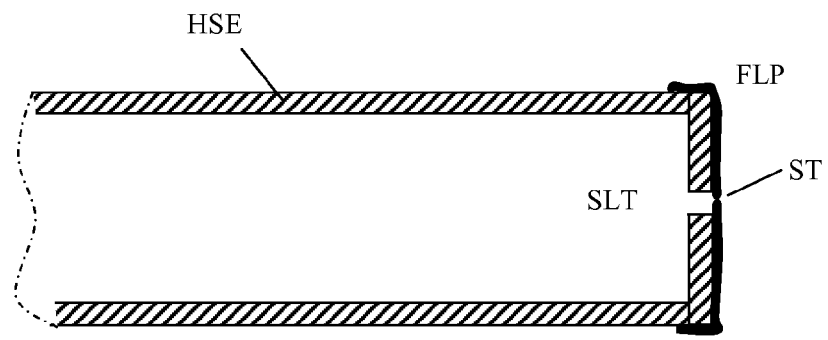
FIG. 2 shows a housing for an interface module, the housing having a slot which is covered by a material having elastic properties, with a slit being cut in the material, the cut being suitable for a chip card to pass through, while the elasticity of the material is sufficient to form a seal around the card.

FIG. 2 shows a cross-sectional view of a housing for an interface module in which an embodiment of the present invention may be deployed. The drawing illustrates the end of the housing which is adapted to receive the chip card. The housing (HSE) has a slot (SLT) which is covered by a material having elastic properties (FLP). The flap is made from a single sheet of material, which may be electrically conductive epoxy or electrically conductive resin for example. The material is attached to the housing in a way which results in the slot being entirely covered by the material. At the level of the slot in the housing, a cut has been made in the material, forming a slit (ST). The cut is sufficient in shape and size for a chip card to be inserted through the slot and into the housing. Thanks to the elastic properties of the material, the material around the cut will be urged against the card thereby forming a seal around the card.

Figure 3:
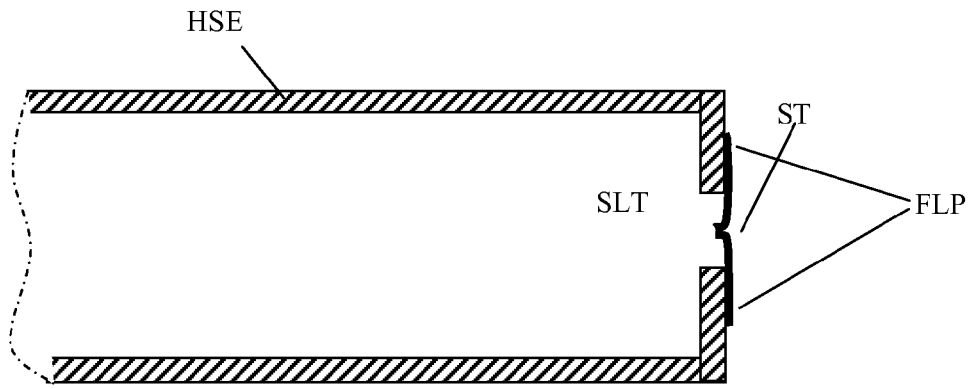
FIG. 3 shows a housing for an interface module similar to that in FIG. 2 but where the covering for the slot is made by attaching two pieces of flexible material to the housing in such a way that the slit is formed between the two pieces of material.
Figure 4:
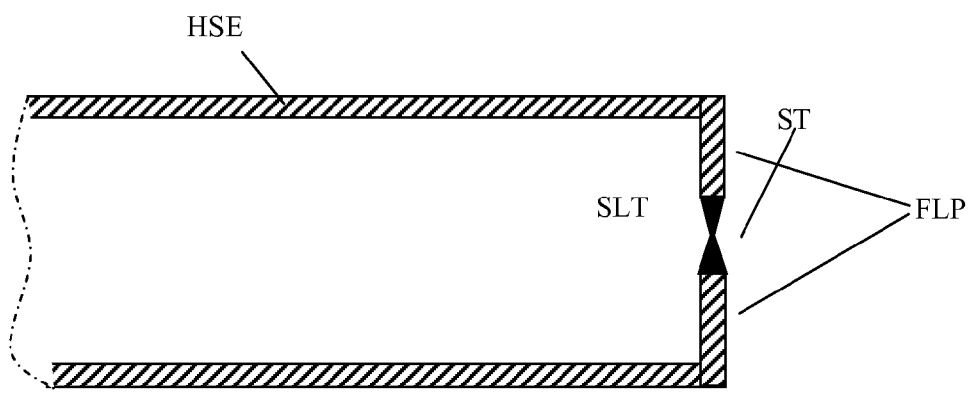
FIG. 4 shows a variation of the embodiment of FIG. 3.
Figure 5:
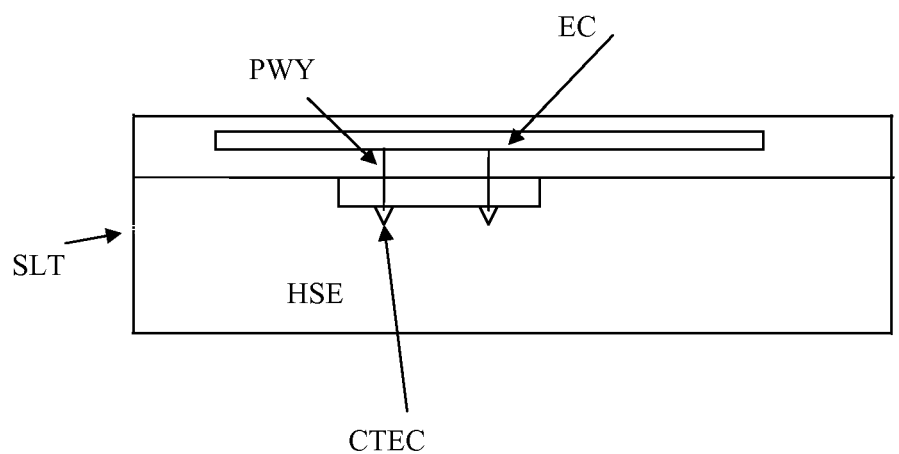
FIG. 5 shows a lateral view of the housing shown in FIG. 1, wherein the electronic component has been made visible as well as the electronic component's contacts and pathways for high-frequency signals.

FIG. 3 shows a housing for an interface module similar to that in FIG. 2 but where the flap comprises two sheets of the material. Each piece of the flexible material is attached to one and another side of the slot (SLT) in the housing (HSE) such that at the place where both sheets meet, they at least touch each other, thereby creating, at the part where they touch, the slit (ST) through which the chip card can pass. Preferably the sheets will overlap sufficiently for the card to be able to pass through and for the elasticity of the flaps to allow for a suitable seal to be formed around the card once inserted. In FIG. 4, the flap, or movable slot shield, is made from two pieces of the material having elastic properties, wherein each of the pieces is attached to a part of the slot in a way that they reduce the size of the slot to a slit just wide enough for the chip card to be inserted. The material is tapered in such a way that it remains flexible enough, at the area where the two pieces meet, such that the card can be introduced through the slit, the elasticity of the material ensuring a sufficient seal around the card.

According to a further embodiment of the present invention, a reduction in the amount of EMI escaping from the inside of the host device towards the outside is achieved by making a housing (HSE) for the host device, or at least for the components of the host device which are susceptible to producing EMI, from a conductive plastic material and by electrically grounding the housing. These materials provide shielding for EMI due to their conductive properties and do not require the additional steps of adding conductive layers or conductive paint and therefore contribute towards minimising the manufacturing cost of a housing (HSE) providing EMI shielding.

It is worth noting that the shielding effect afforded by any of the embodiments of the present invention in which a shield is employed serves not only to reduce the amount of EMI penetrating from the inside of the host device to the outside, but it further serves to reduce the amount of EMI penetrating into the host from outside and thereby reduces the possibility of the components within the housing (HSG) being affected by interference from outside.

In another embodiment of the present invention, provision is made to shield the EMI generated by pathways carrying high frequency signals from contaminating other electronic circuits within the host device and from escaping outside of the host device. Preferably, if measures have been taken to minimise the number of pathways concerned and to reduce to reduce the lengths of such pathways to a minimum, then the aforementioned provision is readily realisable. In this embodiment, as well as making use of the shielding flap (FLP) as described above to prevent EMI from escaping from the host, use is made of a shielding box which isolates those pathways carrying high frequency signals. For example, in an interface between a card reader and a security module (CH) housed on a card or chip card (CC), at least two pathways input/output (IO) and clock (OK) require to be isolated. The offending pathways are geographically isolated and physically located in a region near the slot (SLT) of the host, where they will come into contact with the security module (CH). The flap (FLP) is used to isolate the EMI generated by the pathways from the outside of the host. This isolation is completed by the fact that the host is housed in either a metal box or a box made from conductive plastic as described above. This box is referred to as a housing (HSE). Furthermore, in order to isolate the EMI from the rest of the host's electronic components, a wall is made within the housing (HSE) either from metal or from conductive plastic and electrically grounding it to electromagnetically isolate the offending pathways from the rest of the circuitry in the host device. According to another embodiment, instead of simply forming a wall, the grounded metal or conductive plastic may be shaped to enclose the offending pathways and connect to the flap (FLP), thus creating an EMI-impermeable box within the host device. Joints between the metal or conductive plastic are preferably sealed with electrically conductive epoxy resin as are gaps between the conductive plastic or metal and the flap thereby assuring a maximum isolation.

Conversely, or in combination, as in another embodiment of the present invention, instead of enclosing the offending pathways in an EMI-shielded enclosure, the rest of the circuits in the host device, which may be susceptible to EMI coming from the high-frequency pathways mentioned above, may be insulated from externally-generated EMI by covering them with EMI-shielding conductive epoxy or by wrapping them with EMI-shielding conductive tape. As with all of the techniques involving electrically conductive adhesives, tapes, resins or epoxies, such treatment may be part of a multi-layer treatment where alternating layers of non-conducting and conducting materials, such as adhesives, tapes, resins or epoxies, are applied. Indeed, such materials are known to exist in non-conducting form and in conducting form. A conductive path of a circuit to be protected in this way will thus first be covered with a layer of such a non-conducting material followed by a layer of such a conducting material.

If any of the mentioned high-speed pathways require to cover more than the minimum possible distance, it is preferable to convert such signals to a differential signal over two pathways located in close proximity—preferably adjacent to each other at minimum pitch or, if such pathways exist as wires, then as a twisted pair. The signals should preferably be of a current mode, of minimum common-mode voltage level and have a minimal voltage swing between logic states. A low-voltage differential protocol such as the communication protocol known as LVDS is well-suited for such pathways. According to another embodiment of the present invention, LVDS drivers are used to convert the clock signal from a single-ended wire to a two-ended differential current mode bus terminated with a hundred ohm resistor and conforming to the LVDS communication protocol. One end of the two-ended bus is used to drive the clock pad of the security module. Similar drivers are used to convert the input/output signal to be compatible with the LVDS protocol.

The invention claimed is:

1. An interface module for providing an electrical interface between a security module and a host device, said interface module comprising:

a housing; and an electronic component disposed within the housing, the electronic component having at least one contact configured to make electrical contact with a corresponding contact on the security module;

wherein the housing has a slot formed therein, the slot being sized and shaped to allow the security module to be inserted therethrough, the housing further comprising a movable slot shield for substantially attenuating through propagation of electromagnetic interference generated inside the housing or generated outside the housing, said movable slot shield being made from electrically conductive epoxy, the movable slot shield being configured to allow passage of the security module through the slot such that the contact of the electronic component contacts the corresponding contact on the security module;

wherein at least one pathway extending from a point where the electrical contact is made is covered by alternate layers of one of non-conducting and conducting adhesives, non-conducting and conducting tapes, non-conducting and conducting resins or non-conducting and conducting epoxies.

2. The interface module according to claim 1, wherein a slit is formed in the movable slot shield, the slit being formed to allow insertion of the security module through the slit.

3. The interface module according to claim 1, wherein at least part of the movable slot shield is fixed to the housing by gluing, welding or soldering, said movable slot shield having elastic properties sufficient to allow at least part of the movable slot shield to move in order for said passage of the security module through the slot, said elastic properties being further sufficient to provide movement of the part of the movable slot shield to a position allowing for said attenuation.

4. The interface module according to claim 1, wherein the movable slot shield comprises a piece of material sufficiently large to cover the slot, said slit being formed by making a cut through the material, the cut being of sufficient dimension to allow the passage of the security module.

5. The interface module according to claim 1, wherein the movable slot shield comprises a first piece of material and a second piece of material, the first piece of material being attached to the housing on a first side of the slot thereby leaving at least one edge of the material free, the second piece of material being attached to the housing on a second side of the slot thus leaving at least one edge of material free, the pieces of material being positioned such that the free edge of the first sheet touches the free edge of the second sheet, said slit being formed along a line where the first and second sheets meet.

6. The interface module according to claim 1, wherein the movable slot shield comprises a first piece of material and a second piece of material, the first piece of material being attached to the housing on a first side of the slot thereby leaving at least one edge of the material free, the second piece of material being attached to the housing on a second side of the slot thus leaving at least one edge of material free, the pieces of material being positioned such that the free edge of the first sheet overlaps the free edge of the second sheet, said slit being formed along said overlap, said overlap being of an amount which is sufficient to allow insertion of the security module through the slit.

7. The interface module according to claim 1, wherein the housing is made from a conductive material, said housing being electrically grounded.

8. The interface module according to claim 1, wherein the interface module is included into the host device.

\* \* \* \* \*